United States Patent

Lophitis et al.

(10) Patent No.: US 9,543,305 B2
(45) Date of Patent: Jan. 10, 2017

(54) REVERSE CONDUCTING POWER SEMICONDUCTOR DEVICE

(71) Applicant: ABB Technology AG, Zurich (CH)

(72) Inventors: Neophythos Lophitis, Cambridge (GB); Florin Udrea, Cambridge (GB); Umamaheswara Vemulapati, Wettingen (CH); Lulian Nistor, Niederweningen (CH); Martin Arnold, Baden (CH); Jan Vobecky, Lenzburg (CH); Munaf Rahimo, Uezwil (CH)

(73) Assignee: ABB SCHWEIZ AG (CH)

( * ) Notice: Subject to any disclaimer, the term of this patent is extended or adjusted under 35 U.S.C. 154(b) by 0 days.

(21) Appl. No.: 15/078,602

(22) Filed: Mar. 23, 2016

(65) Prior Publication Data

US 2016/0284708 A1    Sep. 29, 2016

(30) Foreign Application Priority Data

Mar. 23, 2015    (EP) .................................... 15160264

(51) Int. Cl.
    *H01L 29/66*       (2006.01)
    *H01L 27/102*      (2006.01)
    (Continued)

(52) U.S. Cl.
    CPC ..... *H01L 27/1027* (2013.01); *H01L 29/41716* (2013.01); *H01L 29/87* (2013.01)

(58) Field of Classification Search
    CPC . H01L 27/1027; H01L 29/87; H01L 29/41716
    See application file for complete search history.

(56) References Cited

U.S. PATENT DOCUMENTS 8,847,277 B2 *    9/2014    Rahimo .............. H01L 29/7416
                                                                 257/152
9,130,477 B2 *    9/2015    Marquardt .............. H02M 7/49
(Continued)

FOREIGN PATENT DOCUMENTS

EP           0631321 A1     6/1994
JP           S57153467      9/1982
(Continued)

OTHER PUBLICATIONS

Umamaheswara Vemulapati, Marco Beliini, Martin Arnold, Munaf Rahimo, Thomas Stiasny, "The Concept of Bi-mode Gate Commutated Thyristor: A New Type of Reverse Conducting IGCT", 4 Pages.

(Continued)

*Primary Examiner* — Nicholas Tobergte
(74) *Attorney, Agent, or Firm* — Taft Stettinius & Hollister LLP

(57) ABSTRACT

A RC power semiconductor is provided which comprises a plurality of diode cells and a plurality of GCT cells. Each GCT cell comprises a first cathode layer with at least three cathode layer regions, which are separated from each other by a base layer. In orthogonal projection onto a plane parallel to the first main side each one of the cathode layer regions is strip-shaped and a width (w, w'), wherein the diode cells alternate with the GCT cells in a lateral direction in at least a mixed part, wherein in each GCT cell, the width (w') of each one of the two outer cathode layer regions next to a diode cell neighboring to that GCT cell is less than the width (w) of any intermediate cathode layer region between the two outer cathode layer regions in that GCT cell.

19 Claims, 5 Drawing Sheets

(51) Int. Cl.
  *H01L 29/87* (2006.01)
  *H01L 29/417* (2006.01)

(56) References Cited

U.S. PATENT DOCUMENTS

| | | | |
|---|---|---|---|
| 9,263,969 B2 * | 2/2016 | Eckel | H02M 1/32 |
| 9,324,708 B2 * | 4/2016 | Storasta | H01L 29/0696 |
| 9,385,223 B2 * | 7/2016 | Rahimo | H01L 29/7416 |

FOREIGN PATENT DOCUMENTS

| | | |
|---|---|---|
| JP | S5840861 | 3/1983 |
| JP | H104188 | 1/1998 |
| WO | 2012041958 A2 | 4/2012 |

OTHER PUBLICATIONS

European Search Report, 15160264.6, ABB Technology AG, Sep. 1, 2015.

\* cited by examiner

REVERSE CONDUCTING POWER SEMICONDUCTOR DEVICE

FIELD OF THE INVENTION

The present invention relates to reverse conducting power semiconductor device according to the preamble of claim 1.

BACKGROUND OF THE INVENTION

A known power semiconductor device is the integrated gate commutated thyristor (IGCT) which includes one or more gate commutated thyristor (GCT) cells within a single wafer. Each of the GCT cells is made up from a cathode electrode in form of a cathode metallization layer, an $n^+$-doped cathode layer, a p-doped base layer, an $n^-$-doped drift layer, an n-doped buffer layer, a $p^+$-doped anode layer and an anode electrode in form of an anode metallization layer. The GCT cells also include a gate electrode in the form of a gate metallization layer which is in contact with the doped base layer. The gate metallization layer is arranged in a plane which is below the plane in which the cathode electrodes are arranged in order for the gate metallization layer to be separated from the cathode electrodes. The IGCT includes at least one gate contact in the form of an annular metallic region either in the centre of the wafer, at the perimeter of the wafer or somewhere in between. The gate contact region is in direct contact with the gate metallization layer so that the gate contact region and the gate electrodes of all GCT cells are connected electrically and thermally with each other.

Another known power semiconductor device is the reverse conducting integrated commutated thyristor (RC-IGCT) which includes within one single wafer an IGCT part and a single built-in freewheeling diode part. The freewheeling diode part is made of one single diode including a p-doped anode layer and an $n^+$-doped cathode layer, which are separated by the $n^-$-doped drift layer and the n-doped buffer layer. The diode is arranged adjacent to the IGCT part in such a way as to either be in the innermost or outermost region of the wafer. Between the IGCT part and the freewheeling diode part there exists an $n^-$-doped separation region which separates the p-doped base layers of the GCT cells in the IGCT part from the p-doped anode layer of the diode.

In FIGS. 1 and 2 there is shown a power semiconductor device known as the bi-mode gate commutated thyristor (BGCT). FIG. 1 shows the device in top view and FIG. 2 shows the device in cross section taken along line c'-c in FIG. 1. The BGCT is similar to the RC-IGCT and comprises in a single wafer 1 a plurality of gate commutated thyristor (GCT) cells 2 electrically connected in parallel to one another. The GCT cells 2 in the BGCT are identical to the GCT cells found in the RC-IGCT. In the BGCT shown in FIGS. 1 and 2 each of the GCT cells 2 is made up from three cathode electrodes 3 in form of a cathode metallization layer, an $n^+$-doped cathode layer comprising three strip-shaped cathode segments 4, a p-doped base layer 5, an $n^-$-doped drift layer 6, an n-doped buffer layer 7, a $p^+$-doped anode layer 8 and an anode electrode 9 in form of an anode metallization layer. Like in the IGCT, the GCT cells 2 also include a gate electrode 10 in the form of a gate metallization layer which is in contact with the doped base layer 5. The gate metallization layer is arranged in a plane which is below the plane, in which the cathode electrodes 3 are arranged, so that the gate metallization layer is separated from the cathode electrodes 3. The BGCT includes one single gate contact 11 in the form of an annular metallic region in the centre of the wafer 1. The gate contact 11 is in direct contact with the gate metallization layer so that the gate contact 11 and the gate electrodes 10 of all GCT cells 2 are connected electrically and thermally with each other.

In contrast to the RC-IGCT the BGCT comprises not only a single freewheeling diode part with a single diode but a plurality of diode cells 12 distributed between the GCT cells 2. The diode cells 12 are electrically connected in parallel to one another and to the GCT cells 2, albeit with opposing forward direction. Each diode cell includes an anode electrode 17, a p-doped anode layer 13 and an $n^+$-doped cathode layer 14, and a cathode electrode 16, wherein the p-doped anode layer 13 and the $n^+$-doped cathode layer 14 are separated by the $n^-$-doped drift layer 6 and the n-doped buffer layer 7. Neighbouring GCT cells 2 and diode cells 12 are separated by multiple separation regions 15.

FIG. 3 shows a cross section of a modification of the BGCT shown in FIG. 2, in which in the GCT cell 22 cathode segments 4 that lie in the immediate proximity of a diode cell 12 are surrounded by a gate electrode 20 from all sides. In this case the separation region 15 is laterally spaced from the next cathode segment 4 by a greater distance than in the embodiment shown in FIG. 2 as a wider base layer is required to have enough space for the portion of the gate electrode 20 which is arranged between the separation region 15 and the adjacent cathode segment 4, respectively. Elements in FIG. 3 having reference signs already used in FIG. 2 are identical to the corresponding elements of the device shown in FIG. 2.

The BGCT is disclosed in WO 2012/041958 A2 and in the article "The concept of Bi-mode Gate Commutated Thyristor—A new type of reverse conducting IGCT" by U. Vemulapati et al. in Power Semiconductor Devices and ICs (ISPSD), 2012, pp. 29 to 32, for example.

One of the advantages of the distributed diode and IGCT cells in the same wafer in the BGCT design over the standard RC-IGCT design is the better thermal resistance, because due to the distributed diode cells 12 and IGCT cells 2 the heat is distributed more uniformly in the wafer 1. For example when the BGCT is working in IGCT mode the heat can easily spread from the GCT cells 2 into the diode cells 12. Instead, in the standard RC-IGCTs, the temperature spreads much less efficiently into the diode area because it is concentrated in one continuous area. The same phenomenon is observed when the device is operating in the diode mode.

The maximum controllable current (MCC) and the on-state voltage are important parameters in the above described devices. It is desired to achieve the highest possible MCC and the lowest possible on-state voltage to minimize the losses in the device. Further, uniform turn-on and turn-off are most critical to avoid local overheating.

SUMMARY OF THE INVENTION

It is the object of the invention to provide a reverse conducting power semiconductor device which has improved electrical characteristics with regard to uniformity of the turn-on and turn off, the maximum controllable current and the on-state voltage compared to the known BGCT.

The object is attained by a reverse conducting power semiconductor device according to claim 1.

With the reverse conducting power semiconductor device of the invention the maximum controllable current (MCC) per unit area can be increased and on-state voltage and, therefore, also the conduction losses can be decreased compared to the above described BGCT design. The improvement in the MCC is achieved by the special design of the outer cathode layer regions which lie in the immediate proximity of a neighbouring diode cell. The reduction in the on-state voltage drop (conduction loss) comes from the improved plasma distribution. During turn-off a more uniform plasma extraction from the gate electrodes can be achieved. This increases the current limit for dynamic avalanche induced retriggering while at the same time the hard drive limit of the device is made higher than this. Furthermore in the reverse conducting power semiconductor, the diode part helps the extraction of plasma from the base layer of the GCT cells, which also improves the current controllability.

Further developments of the invention are specified in the dependent claims.

In an exemplary embodiment, in each gate commutated thyristor cell in the mixed part, the width of each one of the two outer cathode layer regions is 20% to 75% of the width of any intermediate cathode layer region between these two outer cathode layer regions in that gate commutated thyristor cell. In the range of 20% to 75% the MCC is high in a wide range of temperatures. With a width above the lower limit of 20% a low on-state voltage can be achieved.

In another exemplary embodiment, in each gate commutated thyristor cell in the mixed part, the width of each one of the two outer cathode layer regions is 20% to 75% of the width of any intermediate cathode layer region between these two outer cathode layer regions in that gate commutated thyristor cell. In this embodiment a high MCC can be combined with a low on-state voltage.

In an exemplary embodiment the mixed part includes a plurality of gate commutated thyristor cells.

In an exemplary embodiment, the ratio of the number of diode cells relative to the number of first cathode layer regions in the mixed part is in a range from 1:3 to 1:5, exemplarily 1:3 or 1:4.

In an exemplary embodiment a minimum distance between each second anode layer and the base layer of a neighbouring gate commutated thyristor cell is in a range between 20 µm and 150 µm, exemplarily in a range between 50 µm and 100 µm. In this embodiment separation regions between each second anode layer and the neighbouring base layer are sufficiently broad to provide a sufficient blocking capability for a gate voltage required to drive the GCT, i.e. a gate to cathode blocking capability is ensured during GCT turn-off, while dimensions for maximum total area utilization, as well as for maximum plasma spreading from the GCT regions to the diode regions in GCT mode of operation and vice versa.

In an exemplary embodiment, in an orthogonal projection onto the plane parallel to the first main side, each one of the second anode layers is strip-shaped with a length in a direction along a longitudinal axis thereof and a width in a direction vertical to the longitudinal axis thereof, the width of each second anode layer being less than its length. With these features the wafer area can be utilized most efficiently. Exemplarily the wafer has in an orthogonal projection onto the plane parallel to the first main side a circular shape defining a centre of the wafer and a plurality of radial directions extending from the centre of the wafer, and the first cathode layer regions and the second anode layers are arranged with their longitudinal axis aligned along one of the radial directions, respectively. Exemplarily the strip-shaped cathode layer regions and second anode layers are placed in one or more concentric rings around the centre of the wafer. Therein, exemplarily in each ring the length of each strip-shaped cathode layer region is identical to the length of any other strip-shaped cathode layer in this ring.

In an exemplary embodiment the reverse-conducting power semiconductor device of the invention comprises a common gate contact for contacting the gate electrodes of the plurality of gate commutated thyristor cells, wherein the common gate contact is arranged on the first main side.

In an exemplary embodiment, in each one of the gate commutated thyristor cells in the mixed part, the widths of the two outer cathode layer regions are identical and the widths of any intermediate cathode layer regions are identical.

In an exemplary embodiment the width of each first cathode layer region is in a range between 25 µm to 500 µm.

In an exemplary embodiment, in each gate commutated thyristor cell, in an orthogonal projection onto the plane parallel to the first main side, the gate electrode extends between each pair of neighbouring cathode layer regions in this gate commutated thyristor cell and is separated from any diode cell neighbouring to that gate commutated thyristor cell by the cathode layer region next to the diode cell in a direction vertical to the longitudinal axis of that cathode layer region.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF EXEMPLARY EMBODIMENTS

Figure 1:
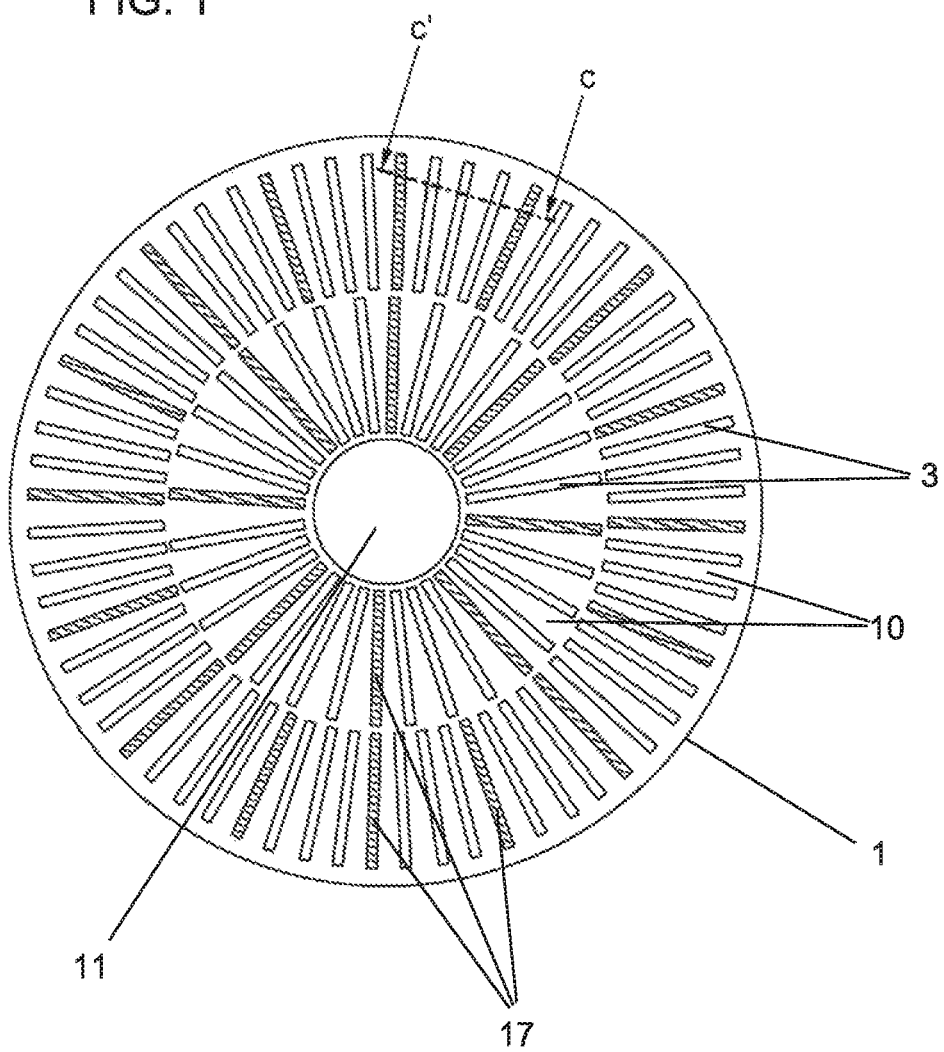
FIG. 1 shows a top view onto a known bi-mode gate commutated thyristor (BGCT)
Figure 2:
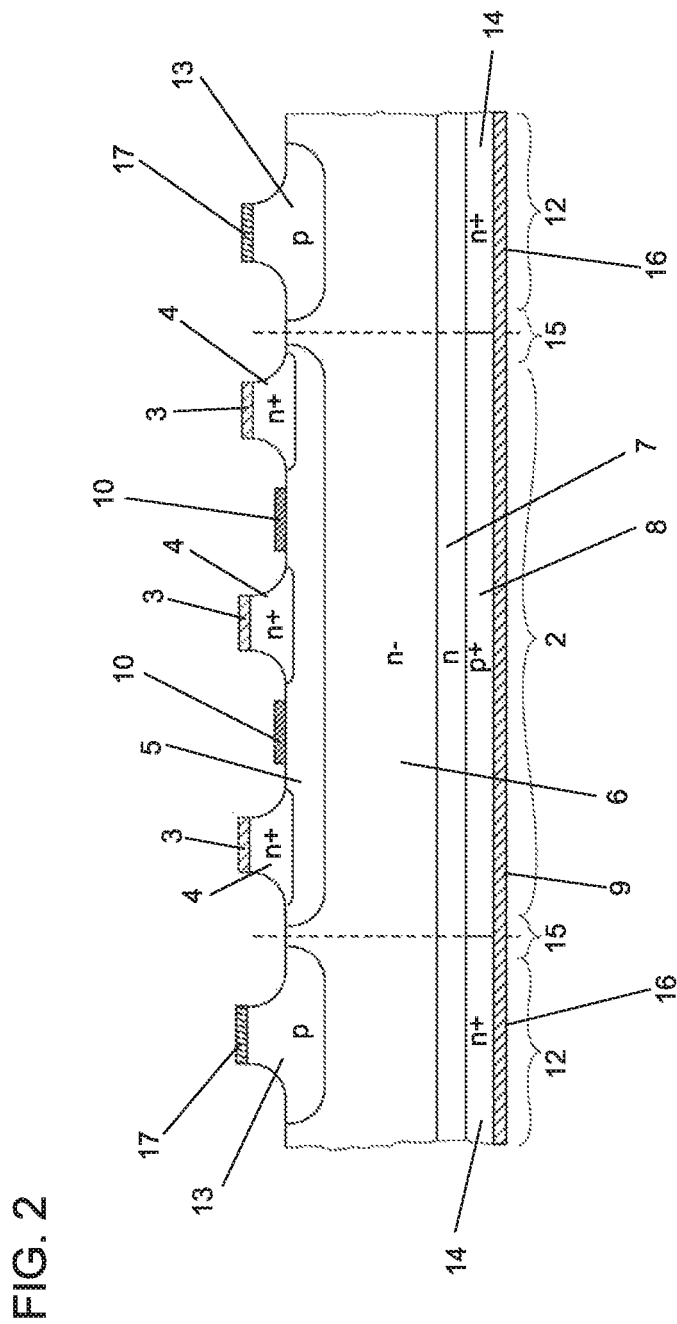
FIG. 2 shows a cross section of the known BGCT taken along line c'-c in FIG. 1.
Figure 3:
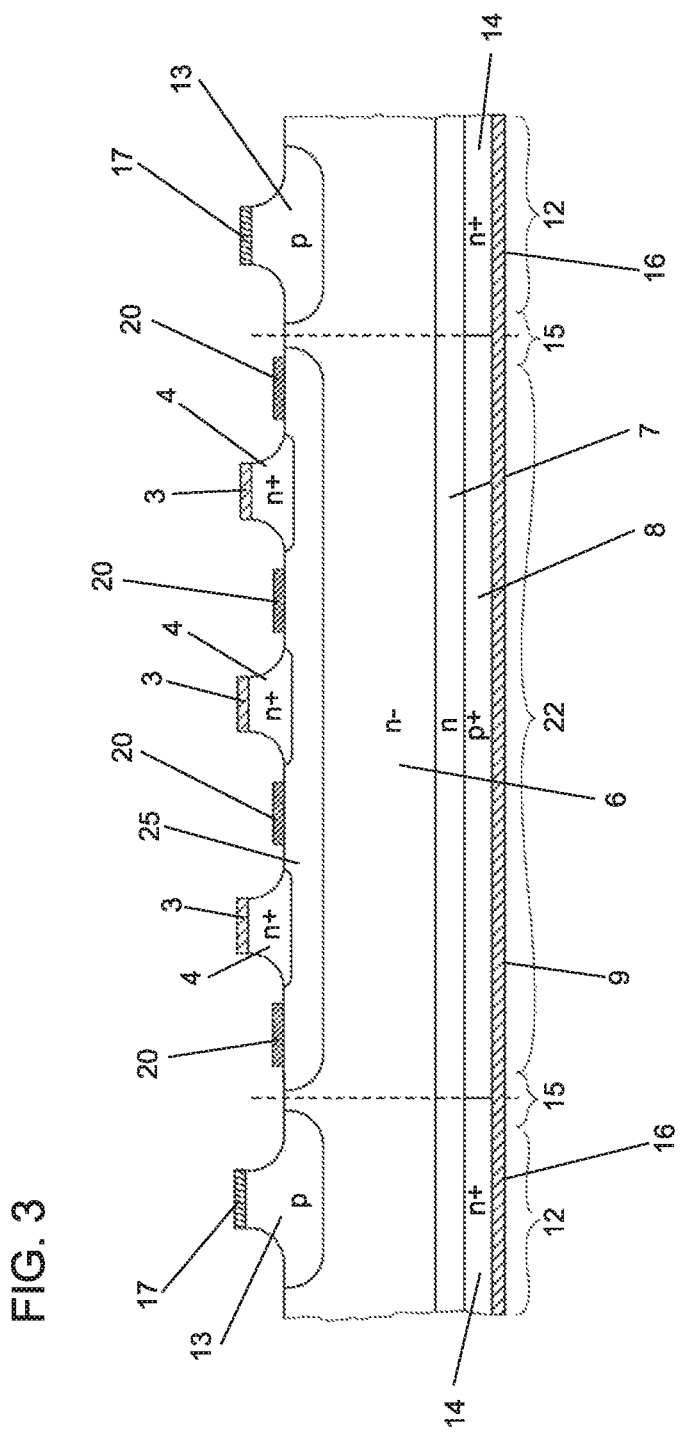
FIG. 3 shows a cross section of a modification of the known BGCT taken along line c'-c in FIG. 1.
Figure 4:
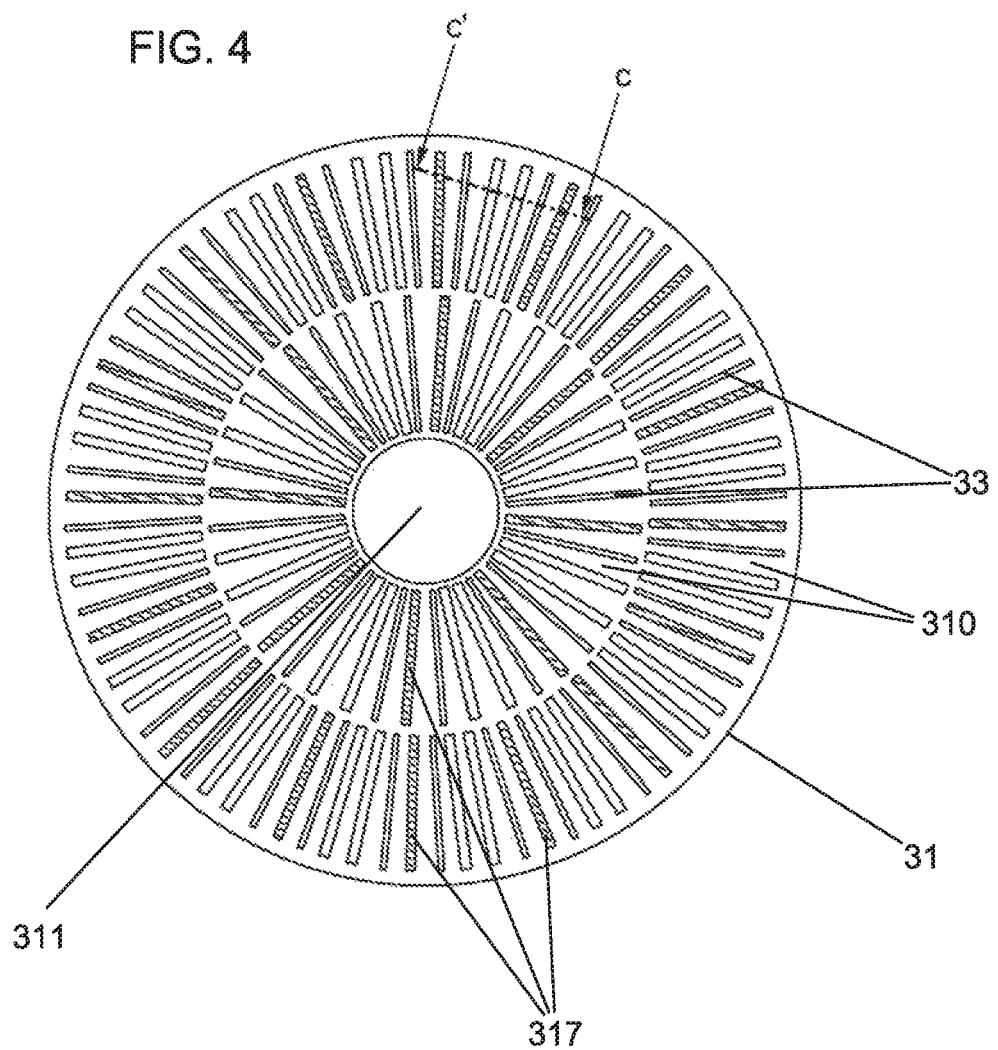
FIG. 4 shows a top view onto a reverse conducting power semiconductor device according to an embodiment of the invention.
Figure 5:
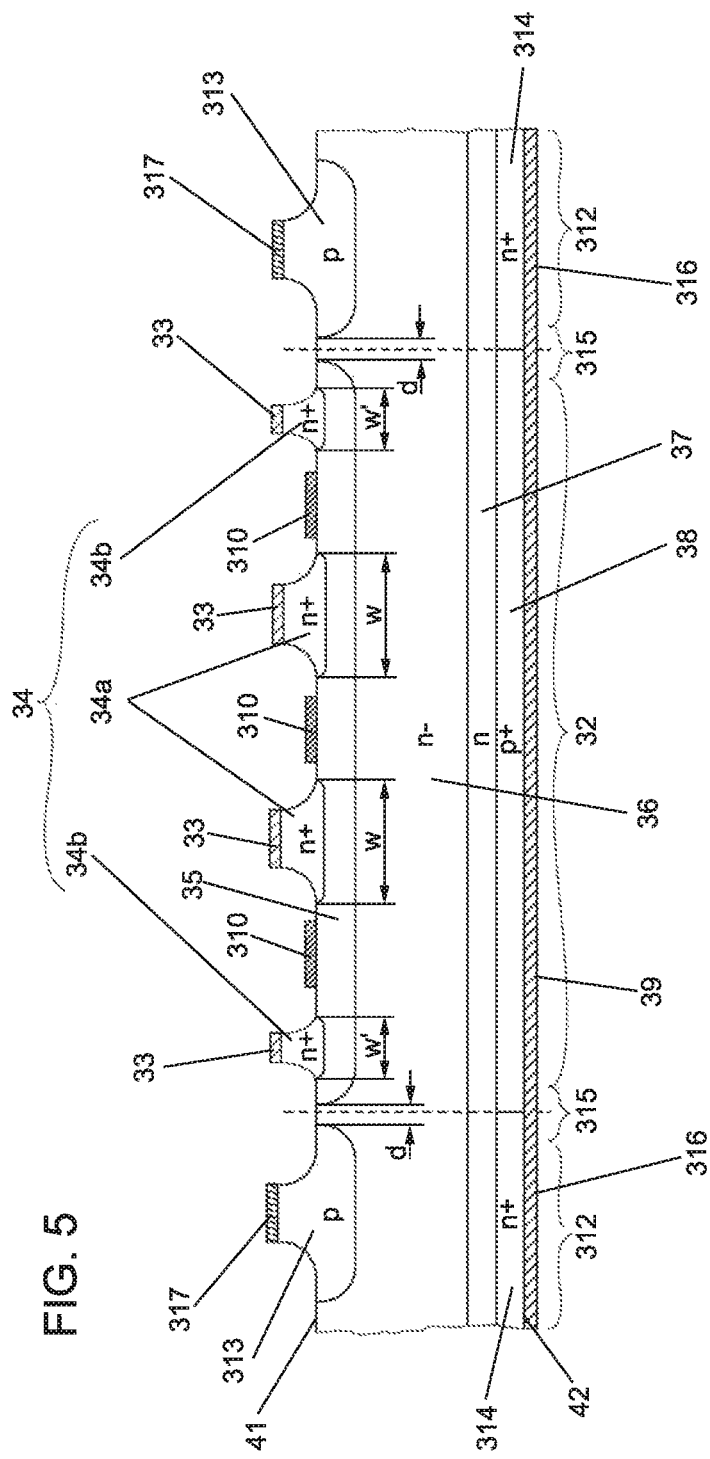
FIG. 5 shows a cross section of the reverse conducting power semiconductor device according to the embodiment along line c'-c in FIG. 4.

In FIGS. 4 and 5 there is shown an embodiment of the reverse conducting power semiconductor device according to the invention. FIG. 4 shows a top view onto the reverse conducting power semiconductor device while FIG. 5 shows a cross section thereof along a line c'-c in FIG. 4.

The reverse conducting power semiconductor device according to the embodiment comprises a semiconductor wafer 31, exemplarily a silicon wafer, having a first main side 41 and a second main side 42, which is arranged parallel to the first main side 41. It comprises a plurality of gate commutated thyristor (GCT) cells 32 and a plurality of diode cells 312. Each GCT cell 32 comprises in the order from the first main side 41 to the second main side 42 a first cathode electrode 33, a $n^+$-doped first cathode layer 34, a p-doped base layer 35, a p-doped first anode layer 38, and a first anode electrode 39. The p-doped base layer 35 is separated from the p-doped first anode layer 38 by an $n^-$-doped drift layer 36 forming a pn-junction with the p-doped base layer 35 and a n-doped buffer layer 37 forming a pn-junction with the p-doped first anode layer 38. The first cathode layer 34 of each GCT cell 32 includes four cathode layer regions 34a and 34b, which are separated from each other by the base layer 35.

Further, each GCT cell 32 comprises a gate electrode 310 which is arranged lateral to the first cathode layer 34, and which is separated from the first cathode layer 34, by the base layer 35. Throughout this patent specification the term "lateral" relates to a lateral direction which is a direction parallel to the first main side 41.

The drift layer 36 may have a net doping concentration exemplarily between $n=5.0 \cdot 10^{11}$ cm$^{-3}$ and $n=1.0 \cdot 10^{14}$ cm$^{-3}$, more exemplarily less than $5 \cdot 10^{13}$ cm$^{-3}$. The base layer 35 as well as the first anode layers 38 may have a net doping concentration exemplarily between $p=1 \cdot 10^{16}$ cm$^{-3}$ and $p=1 \cdot 10^{19}$ cm$^{-3}$, and the first cathode layer 34 may have a net doping concentration exemplarily between $n=1 \cdot 10^{18}$ cm$^{-3}$ and $n=1 \cdot 10^{21}$ cm$^{-3}$. Exemplarily the cathode layer regions 34a and 34b all have the same net doping concentration. Likewise all first anode layers 38 may have the same net doping concentration. Therein the buffer layer 37 has a rising net doping concentration towards the second main side 42, whereas the drift layer 36 has typically a constant doping concentration lower than that of the buffer layer 37. Throughout this specification the net doping concentration of a layer refers to a local doping concentration in case that a doping profile of this layer is described. If no doping profile is described, the net doping concentration of a layer refers to the maximum net doping concentration in this layer.

In the present embodiment the base layers 35 as well as the first anode layers 38 exemplarily have a thickness in a direction perpendicular to the first and second main side 41, 42 of the wafer 31 between 1 μm and 250 μm, exemplarily between 2 μm and 150 μm or between 10 μm and 150 μm. Exemplarily, the base layers 35 all have the same layer thickness. Likewise, the first anode layers 38 may all have the same thickness. The thickness of the drift layer 36 in a direction perpendicular to the first and second main side 41, 42 of the wafer 31 depends on the rated voltage of the device. It is exemplarily between 280 μm and 440 μm for a 3.3 kV device or between 380 μm and 570 μm for a 4.5 kV device. Therein, the thickness of the drift layer 36 in a GCT cell 32 is the minimum distance between the buffer layer 37 and the base layer 35 of this GCT cell 32.

In orthogonal projection onto a plane parallel to the first main side 41 each one of the cathode layer regions 34a and 34b is strip-shaped with a length in a direction along a longitudinal axis thereof and a width w, w' in a direction vertical to the longitudinal axis, the width w, w' of each cathode layer region 34a, 34b being less than its length. Throughout the specifications strip-shaped means a longitudinal shape wherein the length in the longitudinal direction is longer than the width of the strip-shaped region in a width direction perpendicular to the longitudinal direction and parallel to the first main side 41 or the second main side 42 of the wafer 31. Throughout this specification the width of a strip-shaped region is the maximum dimension of the strip-shaped region in the width direction.

In the orthogonal projection onto a plane parallel to the first main side 41, in each GCT cell 32, the width w' of each one of the two outer cathode layer regions 34b next to two diode cells 312 neighbouring to that GCT cell 32 on opposite sides thereof is less than the width w of any intermediate cathode layer region 34a between the two outer cathode layer regions 34b in that GCT cell 32. Therein, the width w' of each outer cathode layer region 34b next to a neighbouring diode cell 312 is 20% to 75%, exemplarily 40% to 60%, of the width w of any intermediate cathode layer region 34a in the same GCT cell 32. The lateral width w, w' of each strip-shaped cathode layer region 34a and 34b in a direction perpendicular to its longitudinal axis is exemplarily between 25 μm and 500 μm.

In the present embodiment the gate electrode 310 in each GCT cell 32 extends, in an orthogonal projection onto a plane parallel to the first main side 41, between each pair of neighbouring cathode layer regions 34a, 34b in this GCT cell 32 and is separated from any diode cell 312 neighbouring to that GCT cell 32 by the outer cathode layer region 34b next to that neighbouring diode cell 312 in a direction vertical to the longitudinal axis of that outer cathode layer region 34b. In other words the gate electrode 310 extends between each pair of cathode layer regions 34a, 34b but not between the outer cathode layer region 34b next to a neighbouring diode cell 312 and this neighbouring diode cell 312.

Each diode cell 312 comprises in the order from the first main side 41 to the second main side 42 a second anode electrode 317, a p-doped second anode layer 313, a n$^+$-doped second cathode layer 314, and a second cathode electrode 316. The second cathode layer 314 is arranged alternating to the first anode layer 38 in a lateral direction on the second main side 42 and is separated from the second anode layer 313 by the drift layer 36 and the buffer layer 37. The drift layer 36 forms a pn-junction with the second anode layer 313. Each second anode layer 313 is, in orthogonal projection onto a plane parallel to the first main side 41, strip-shaped with a length in a direction along a longitudinal axis thereof and a width in a direction vertical to the longitudinal axis, the width of each second anode layer 313 being less than its length.

The second anode layers 313 may have a net doping concentration exemplarily between $p=1 \cdot 10^{16}$ cm$^{-3}$ and $p=1 \cdot 10^{19}$ cm$^{-3}$, and the second cathode layers 314 may have a net doping concentration exemplarily between $n=1 \cdot 10^{18}$ cm$^{-3}$ and $n=1 \cdot 10^{21}$ cm$^{-3}$. Exemplarily the second cathode layers 314 all have the same net doping concentration. Likewise all second anode layers 313 may have the same net doping concentration.

The base layer 35 of each GCT cell 32 is separated from neighbouring second anode layers 313 by an n-type separation region 315 formed by the drift layer, respectively. The separation regions 315 between a diode cell 312 and a neighbouring GCT cell 32 have a lateral width d (which is the minimum distance between the second anode layer 313 and the base layer 35 of a neighbouring GCT cell 32) between 20 μm and 150 μm, exemplarily between 50 μm and 100 μm. The width d of separation regions 315 must be large enough to avoid a punch-through effect to block the gate voltage required for turn-off or during blocking. On the other side the lateral width should be small enough to allow the electron hole plasma of each GCT cell 32, which forms in the drift layer 36 during on-state of the GCT cell 32, to spread into the neighbouring second diode cells 312. A passivation layer (not shown in the figures) may be formed on the separation region 315.

In the present embodiment each gate electrode 310 is formed as part of a gate metallization layer on the base layers 35, wherein the surface of the first gate metallization layer opposite to the base layers 35 defines a first plane. The surfaces of the first cathode electrodes 33 opposite to the cathode layer regions 34a, 34b and the surfaces of the second anode electrodes 317 opposite to the second anode layers 313 define a second plane. In other words, all first cathode electrodes 33 and all second anode electrodes 317 are all arranged in the same plane. Therein, the first plane is parallel to the second plane and is shifted from the second plane in a direction from the first main side 41 to the second main side 42. This mesa structure facilitates contacting the first cathode electrodes 33 and the second anode electrodes 317 on the first main side 41 with a metal plate, such as a molybdenum disk in a standard press pack.

In the present embodiment, in a projection orthogonal to the first and second main side 41, 42, the first anode layer 38 of each GCT cell 32 is aligned with the base layer 35 of the same GCT cell 32 to have a maximum overlap between these two layers in each GTC cell 32, and the second anode layer 313 of each diode cell 312 is aligned with the second cathode layer 314 of the same diode cell 312 to have a maximum overlap between these two layers in each diode cell 312.

In FIG. 4 which shows a top view onto the first main side 41 of the wafer 31 there can be seen the pattern of first cathode electrodes 33 formed on the top surface of the cathode layer regions 34a and 34b of the GCT cells 32 and of the second anode electrodes 317 which are formed on the top surface of the second anode layers 313, respectively. Each first cathode electrode 33 comprises four strip-shaped electrode portions which correspond to the four strip-shaped cathode layer regions 34a and 34b of the respective GCT cell 32. The second anode electrode 317 is strip-shaped corresponding to the strip-shape of the second anode layer 313 of the respective diode cell 312.

The longitudinal directions of the strip-shaped electrode portions of each first cathode electrode 33 and the strip-shaped second anode electrodes 317 have its longitudinal direction aligned in radial direction which is a direction extending from the centre of the device and being parallel to the first main side 41 of the wafer 31. Therein, the centre of the device is the centre of the first main side 41 of the circular wafer 31.

In the embodiment shown in FIG. 4, the plurality of GCT cells 32 and the plurality of diode cells 312 are arranged in two concentric rings around the centre of the device. In each ring the GCT cells 32 alternate with the diode cells 312. The second anode layers 313 of the diode cells 312 alternate with the first cathode layers 34 of the GCT cells 32 in a lateral direction along the concentric rings, so that, in an orthogonal projection onto a plane parallel to the first main side 41, the first cathode layer 34 of each GCT cell 32 is arranged between a pair of second anode layers 313 of two diode cells 312 neighbouring to the GCT cell 32 on opposite sides of the GCT cell 32 in the lateral direction. Therefore, in FIG. 4 the second anode electrodes 317 alternate with the first cathode electrodes 33, which comprise four strip-shaped electrode portions, respectively, as described above. In each ring the length of each strip-shaped cathode layer region 34a, 34b in this ring is identical to the length of any other strip-shaped cathode layer region 34a, 34b in this ring.

Due to the GCT cells 32 alternating with the diode cells 312, in an orthogonal projection onto the plane parallel to the first main side 41, each diode cell 312 is arranged such that one second anode layer 313 is arranged between the first cathode layers 34 of two neighbouring GCT cells 32 in a lateral direction parallel to the first main side 41.

In the centre region on the first main side 41 of the circular wafer 10 there is arranged a common gate contact 311 to which all gate electrodes 310 of the plurality of GCT cells 32 are electrically connected. The gate electrodes 310 of the GCT cells 32 and the connections there between are implemented as the gate metallization layer described above.

Due to the interdigitated arrangement of diode cells 312 and the GCT cells 32 the full silicon area of the wafer 31 is utilized both electrically and thermally.

With the reverse conducting power semiconductor device of the invention the level of improvement in the maximum current capability (MCC) per unit area could be up to 27% and the improvement in the conduction losses up to 4.5% when compared to the best state of the art BGCT design. When compared to existing art, the improvement in the MCC is achieved because of the special cathode segment design which lie in the immediate proximity of the diode. The reduction in the on-state voltage drop (conduction losses) come from the plasma distribution being optimally spread in the new art. The increased MCC is due to the improved uniformity of the arrangement of the cathode area which in the invention is designed to induce uniform plasma extraction from the gate electrodes throughout the turn-off. This increases the limit for the current for dynamic avalanche induced retriggering while at the same time the hard drive limit of the device is made higher than this. Furthermore in the new art, the diode cells 312 help the extraction of plasma from the base layer 35 in the GCT cells 32 which also improves the current controllability.

As discussed above, the two outer cathode layer regions 34b in the immediate proximity of a neighbouring diode cell 312 should have a width in the range of 20% to 75% with respect to the intermediate cathode layer regions 34a between these two outer cathode layer regions 34b. The upper limit should not be exceeded due to the rapid decline of the MCC at high temperature once this limit is passed. The lower limit is set to ensure the drop in the on-state voltage is not substantial. The rapid decline in the MCC, when the width w' of the two outer cathode layer regions 34b in the immediate proximity of a neighbouring diode cell 312 is more than 75% with respect to the width of the intermediate cathode layer regions 34a, is due to the change in the failure mechanism. In the reverse conducting power semiconductor device of the invention the MCC is limited by dynamic avalanche induced retriggering whereas in the known BGCT which features wider outer cathode layer regions in the immediate proximity of the diode cell fail prematurely due to the violation of the hard drive limit. The hard drive limit gets lower with increasing temperature whereas the limit for avalanche induced retriggering increases with temperature. Furthermore the reverse conducting power semiconductor device of the invention does not compromise any of the benefits of the current state of the art BGCT including efficient spreading of heat into the diode cells when the device is operating in the GCT mode and efficient spreading into the GCT cells when the device is operating in the diode mode.

It will be apparent for persons skilled in the art that modifications of the above described embodiment are possible without departing from the idea of the invention as defined by the appended claims.

In the above described embodiment the reverse conducting power semiconductor device was described with first cathode layers 34 which comprise four strip-shaped cathode layer regions 34a, 34b, respectively. However, it is also possible to use any other number of cathode layer regions above two (i.e. three or more), exemplarily three to six strip-shaped cathode layer regions 34a, 34b could be included in each GCT cell 32. Exemplarily, in the reverse conducting power semiconductor device of the invention, the ratio of the number of diode cells relative to the number of first cathode layer regions may be in a range from 1:3 to 1:5, exemplarily 1:3 or 1:4.

In the above described embodiment the GCT cells 32 alternate with the diode cells 312 in each concentric ring along the whole ring, i.e. GCT cells 32 alternate with the diode cells 312 on the whole wafer area, in a lateral direction. However, it is also possible that the GCT cells 32 alternate with the diode cells 312 not on the whole wafer area but only in a mixed part, whereas the remaining part of the wafer includes GCT cells 32 which do not alternate with diode cells 312. Such part is also known as a pilot part. Likewise the wafer may comprise an area in which diode cells are formed which do not alternate with the GCT cells 32 in this part.

In the above described embodiment the reverse conducting power semiconductor device was described with a circular silicon wafer 31. However, the wafer 31 may have any other shape, such as a rectangular shape, or may be made of a different semiconductor material, such as silicon carbide or a group-III-nitride such as (AlGaIn)N.

The embodiment of the invention was described with a very specific alternating arrangement of the GCT cells 32 and diode cells 312 in two concentric rings. However other arrangements may be employed. The number of concentric rings in which the GCT cells 32 and the diode cells 312 are arranged may be any other number of rings. Also the arrangement of the GCT cells 32 and the diode cells 312 on a rectangular wafer may be an arrangement, in which the strip-shaped second anode layers 313 and the strip-shaped cathode layer regions 34a, 34b are arranged parallel to each other. Such arrangement would be exemplarily for a rectangular wafer shape, for example.

In the above embodiment, the reverse conducting power semiconductor device was described with the buffer layer 37. However, in a modified embodiment, the reverse conducting power semiconductor device does not comprise the buffer layer 37. In this modified embodiment the thickness of the drift layer 36 in a direction perpendicular to the first and second main side 41, 42 of the wafer 31 would have to be larger by a factor of about two compared to the above described embodiment with the buffer layer 37 in order to avoid punch-through under reverse bias conditions.

The above embodiment was explained with specific conductivity types. The conductivity types of the semiconductor layers in the above described embodiments might be switched, so that all layers which were described as p-type layers would be n-type layers and all layers which were described as n-type layers would be p-type layers. For example, in a modified embodiment, the GCT cells 32 could include a p-doped first cathode layer 34, a n-doped base layer 35, a p-doped drift layer 36, and a n-doped first anode layer 38.

The above embodiment was described with a central common gate contact 311. The invention is not limited to such central common gate contact 311. It would also be possible to have a ring-shaped common gate contact at the perimeter of the wafer 31 or between two rings somewhere between the perimeter and the centre of the wafer 31, which can be advantageous to homogenize the current distribution of a gate current pulse.

It should be noted that the term "comprising" does not exclude other elements or steps and that the indefinite article "a" or "an" does not exclude the plural. Also elements described in association with different embodiments may be combined.

LIST OF REFERENCE SIGNS 1 wafer
2 gate commutated thyristor (GCT) cell
3 cathode electrode
4 cathode segment
5 base layer
6 drift layer
7 buffer layer
8 anode layer
9 anode electrode
10 gate electrode
11 gate contact
12 diode cell
13 anode layer
14 cathode layer
15 separation regions
16 cathode electrode
17 anode electrode
20 gate electrode
22 GCT cell
25 base layer
31 semiconductor wafer
32 gate commutated thyristor (GCT) cell
33 first cathode electrode
34 first cathode layer
34a intermediate cathode layer region
34b outer cathode layer region
35 base layer
36 drift layer
37 buffer layer
38 first anode layer
39 first anode electrode
310 gate electrode
311 common gate contact
312 diode cell
313 second anode layer
314 second cathode layer
315 separation region
316 second cathode electrode
317 second anode electrode
41 first main side
42 second main side
w width
w' width
d distance

The invention claimed is:

1. A reverse-conducting power semiconductor device with a wafer having a first main side and a second main side, which is arranged parallel to the first main side, the device comprising a plurality of diode cells and a plurality of gate commutated thyristor cells, wherein each gate commutated thyristor cell comprises in the order from the first to the second main side:
  a cathode electrode;
  a first cathode layer of a first conductivity type;
  a base layer of a second conductivity type different from the first conductivity type;
  a first section of a drift layer of the first conductivity type;
  a first anode layer of the second conductivity type; and
  a first anode electrode,
wherein each gate commutated thyristor cell further comprises a gate electrode, which is arranged lateral to the first cathode layer and separated from the first cathode layer by the base layer, wherein the first cathode layer of each gate commutated thyristor cell includes at least three cathode layer regions, which are separated from each other by the base layer, wherein in orthogonal projection onto a plane parallel to the first main side each one of the cathode layer regions is strip-shaped with a length in a direction along a longitudinal axis thereof and a width (w, w') in a direction vertical to the longitudinal axis, the width (w, w') of each cathode layer region being less than its length, wherein each diode cell comprises in the order from the first main side to the second main side:
 a second anode electrode;
 a second anode layer of the second conductivity type;
 a second section of the drift layer; and
 a second cathode layer of the first conductivity type, wherein the device comprises at least one mixed part, in which the second anode layers of the diode cells alternate with the first cathode layers of the gate commutated thyristor cells in a lateral direction so that, in the orthogonal projection onto the plane parallel to the first main side, the first cathode layer of each gate commutated thyristor cell in the mixed part is arranged between a pair of second anode layers of two diode cells neighbouring to the gate commutated thyristor cell on opposite sides of the gate commutated thyristor cell in the lateral direction, wherein the second anode layers are separated from neighbouring base layers by a separation region of the first conductivity type, wherein in the mixed part, in the orthogonal projection onto the plane parallel to the first main side, in each gate commutated thyristor cell, the width (w') of each one of the two outer cathode layer regions is less than the width (w) of any intermediate cathode layer region between the two outer cathode layer regions in that gate commutated thyristor cell.

2. The reverse-conducting power semiconductor device according to claim 1, wherein in each gate commutated thyristor cell in the mixed part, the width (w') of each one of the two outer cathode layer regions is 20% to 75% of the width (w) of any intermediate cathode layer region between these two outer cathode layer regions in that gate commutated thyristor cell.

3. The reverse-conducting power semiconductor device according to claim 1, wherein in each gate commutated thyristor cell in the mixed part, the width (w') of each one of the two outer cathode layer regions is 40% to 60% of the width (w) of any intermediate cathode layer region in that gate commutated thyristor cell.

4. The reverse-conducting power semiconductor device according to claim 1, wherein the mixed part includes a plurality of gate commutated thyristor cells.

5. The reverse-conducting power semiconductor device according to claim 1, wherein the ratio of the number of diode cells relative to the number of first cathode layer regions in the mixed part is in a range from 1:3 to 1:5.

6. The reverse-conducting power semiconductor device according to claim 1, wherein a minimum distance (d) between each second anode layer and the base layer of a neighbouring gate commutated thyristor cell is in a range between 20 μm and 150 μm.

7. The reverse-conducting power semiconductor device according to any one of claim 1, wherein a minimum distance (d) between each second anode layer and the base layer of a neighbouring gate commutated thyristor cell is in a range between 50 μm and 100 μm.

8. The reverse-conducting power semiconductor device according to claim 1, wherein in the orthogonal projection onto the plane parallel to the first main side, each one of the second anode layers is strip-shaped with a length in a direction along a longitudinal axis thereof and a width in a direction vertical to the longitudinal axis thereof, the width of each second anode layer being less than its length.

9. The reverse-conducting power semiconductor device according to claim 8, wherein the wafer has in an orthogonal projection onto the plane parallel to the first main side a circular shape defining a centre of the wafer and a plurality of radial directions extending from the centre of the wafer, and wherein the first cathode layer regions and the second anode layers are arranged with their longitudinal axis aligned along one of the radial directions, respectively.

10. The reverse-conducting power semiconductor device according to claim 9, wherein the strip-shaped cathode layer regions and second anode layers are placed in one or more concentric rings around the centre of the wafer.

11. The reverse-conducting power semiconductor device according to claim 10, wherein in each ring the length of each strip-shaped cathode layer region is identical to the length of any other strip-shaped cathode layer region in this ring.

12. The reverse-conducting power semiconductor device according to claim 1, comprising a common gate contact for contacting the gate electrodes of the plurality of gate commutated thyristor cells, wherein the common gate contact is arranged on the first main side.

13. The reverse-conducting power semiconductor device according to claim 1, wherein in each one of the gate commutated thyristor cells in the mixed part the widths (w') of the two outer cathode layer regions are identical and the widths (w) of any intermediate cathode layer regions are identical.

14. The reverse-conducting power semiconductor device according to claim 1, wherein the width (w, w') of each first cathode layer region is in a range between 25 μm to 500 μm.

15. The reverse-conducting power semiconductor device according to claim 1, wherein in each gate commutated thyristor cell, in the orthogonal projection onto the plane parallel to the first main side, the gate electrode extends between each pair of neighbouring cathode layer regions in this gate commutated thyristor cell and is separated from any diode cell neighbouring to that gate commutated thyristor cell by the cathode layer region next to the diode cell in a direction vertical to the longitudinal axis of that cathode layer region.

16. The reverse-conducting power semiconductor device according to claim 2, wherein in each one of the gate commutated thyristor cells in the mixed part the widths (w') of the two outer cathode layer regions are identical and the widths (w) of any intermediate cathode layer regions are identical.

17. The reverse-conducting power semiconductor device according to claim 5, wherein the width (w, w') of each first cathode layer region is in a range between 25 μm to 500 μm.

18. The reverse-conducting power semiconductor device according to claim 5, wherein in each gate commutated thyristor cell, in the orthogonal projection onto the plane parallel to the first main side, the gate electrode extends between each pair of neighbouring cathode layer regions in this gate commutated thyristor cell and is separated from any diode cell neighbouring to that gate commutated thyristor cell by the cathode layer region next to the diode cell in a direction vertical to the longitudinal axis of that cathode layer region.

19. The reverse-conducting power semiconductor device according to claim 1, wherein the ratio of the number of diode cells relative to the number of first cathode layer regions in the mixed part is in a range from 1:3 to 1:4.

* * * * *